United States Patent [19]

Ishihara

[11] Patent Number: 4,883,560
[45] Date of Patent: Nov. 28, 1989

[54] PLASMA TREATING APPARATUS FOR GAS TEMPERATURE MEASURING METHOD

[75] Inventor: Shin-ichiro Ishihara, Takatsuki, Japan

[73] Assignee: Matsushita Electric Industrial Co., Ltd., Osaka, Japan

[21] Appl. No.: 309,292

[22] Filed: Feb. 13, 1989

[30] Foreign Application Priority Data

Feb. 18, 1988 [JP] Japan .................................. 63-35707

[51] Int. Cl.⁴ .......................... B44C 1/22; B05D 3/06; C23C 16/00; C23C 14/00
[52] U.S. Cl. .................................... 156/626; 156/345; 156/627; 156/643; 156/646; 118/712; 118/50.1; 118/725; 118/620; 204/192.13; 204/192.33; 204/298; 427/8; 427/38
[58] Field of Search ................ 156/345, 626, 627, 643, 156/646; 427/8, 10, 38, 39; 118/712, 725, 728, 50.1, 620; 204/192.13, 192.33, 298

[56] References Cited

U.S. PATENT DOCUMENTS

| | | | |
|---|---|---|---|
| 4,115,184 | 9/1978 | Poulsen | 156/626 |
| 4,415,402 | 11/1983 | Gelernt et al. | 156/626 |
| 4,430,151 | 2/1984 | Tsukada | 156/626 |
| 4,579,623 | 4/1986 | Suzuki et al. | 156/626 |
| 4,609,426 | 9/1986 | Ogawa et al. | 156/626 |

Primary Examiner—William A. Powell
Attorney, Agent, or Firm—Stevens, Davis, Miller & Mosher

[57] ABSTRACT

Nitrogen gas plasma emission intensities are theoretically calculated at various gas temperatures, while they are actually measured by a spectroscope. By comparing the waveforms of the calculated and measured emission intensities with each other, the nitrogen gas temperature of at an arbitrary point in a plasma treating room can be determined.

6 Claims, 6 Drawing Sheets

PLASMA TREATING APPARATUS FOR GAS TEMPERATURE MEASURING METHOD

BACKGROUND OF THE INVENTION

The present invention relates to a plasma treating apparatus for producing a plasma from a gaseous material including nitrogen atoms and for depositing or etching purposes, and further, to a temperature measuring method of measuring the temperature of surfaces of heated holders, a heated substrate, or local heat sources by comparing a measured distribution of emission intensity due to rotational quantum transition of nitrogen molecules with a calculated distribution.

Heretofore, in order to measure surface temperatures and a temperature distribution of a substrate during depositing or etching processes using plasma, thermocouples contacting with substrate holders have been used. No consideration is paid to possible influences of gas mixture ratios or mixed gas flow rates.

Since surface reactions are generally dominant in plasma dissociation reactions, the influences of substrate temperature on film depositing or etching are variously different from each other in dependence on structures of individual apparatus and substrate holders.

Further, the substrate surface temperature is much influenced by the location of substrate holders. In consequence, temperature measurements through thermocouples have their limits.

Experiments made by D. M. Phillips (Journal of Physics D, volume 9, page 507, 1975), on which the analysis used in the present invention is based, is such that the temperature rise of a nitrogen molecule is instantly measured, and exciting light alone is used as a heat source for heating the nitrogen gas. However, the paper mutes to a substrate, substrate heating method, nor a substrate treatment with plasma, and to influences of mixture gas or mixture gas flow rate.

SUMMARY OF THE INVENTION

For solving the above-mentioned problems in the prior art, the present invention provides an apparatus and a method wherein a distribution of transition between rotational quanta of second positive emission group of nitrogen occurring in a plasma treatment is calculated, and the result of the calculation is compared with measured emission spectrum data of nitrogen molecules obtained when the electric power for producing plasma is maintained constant and the set value of substrate temperature is varied, and with emission data obtained when the set value of substrate temperature maintained constant and the electric power for producing plasma is varied. As a result of this comparison, factors affecting temperature rises of the nitrogen gas can be discriminated, thereby making it possible to determine the surface temperature of a substrate. Further these data are incorporated into some feed-back circuits in the plasma treating apparatus.

Variations in temperature rise rate of a substrate depending on individual apparatuses and substrate holders the dependency of the temperature on location, and positions where abnormal discharges are occurring are disclosed by locally measuring of emission spectrums of nitrogen molecules. Further, these results are incorporated into feed-back circuits in the plasma treating apparatus, thereby assuring a more reliable operation of the plasma treatment apparatus.

Atoms or molecules take various motions in a free space, and the momentums thereof vary under influences of external forces (such as light, magnetic field, electric field, and so on). When the energy is increased to a high level by an external force, the state become unstable, and returns to the bottom state. In this process, there may occur a luminescence or emission, which is so-called as an electric discharge. Detailed studies of the emission spectrum have showed that the spectrum varies in dependence on the gas temperature.

The difference of spectrum has been known to result from molecular motions. It is also known that, in a gas state where a glow discharge can occur, a correlation exists between rotational energy and gas temperature. The rotational energy is about 1.6 cm$^{-1}$ *in the case of a nitrogen molecule*.

Hydrogen exists in large quantities in a $SiH_4$ glow discharge for producing amorphous silicon ($\alpha$— Si : H), and has been studied in detail in the past. In consequence, the detailed characteristics of hydrogen are well known at the present time. However, the emission spectrum of hydrogen is continuous, and a hydrogen molecule has no rotational mode. In consequence, the gas temperature can not be measured based on a rotational mode. It is known that, when a gas temperature is raised, hydrogen molecules are dissociated through hydrogen discharge. However, unless the gas temperature is known, the process of electron collision and the process of heat dissociation are not clear and can not be distinguished from each other.

Different from hydrogen, nitrogen has a clear emission spectrum originated from a rotational mode. The plasma temperature measuring method of the present invention is based on a study of glow discharge of nitrogen, which includes an analysis of rotational mode for determining the value of gas temperature. Namely, this method is a so-called "gas temperature determination based on an undissociated emission band in nitrogen discharge". Slovetskii and Sokolov measured firstly the rotational mode temperature Tr through this method (Opt. Spectrosc. vol. 36, page 265, 1974). They adopted a very simple way for temperature determination in which the temperature Tr is determined by measuring a width of a spectrum measured at emission intensity level of ½ peak value. They referred to nothing with respect to substrate heating or gas heating other than a plasma discharge electric power. In the method of the present invention, detailed calculations are carried out with respect to all the rotational modes, and measured spectra are compared with the results of these calculations. In consequence, precise gas temperatures can be obtained. Heretofore, this method has required a discharge to be maintained in a steady state, and to specify emission lines for respective quantum numbers from a spectrum measured by a high precision spectroscope. Therefore, this prior art method can not be applied when the measurement is required to be carried out in a short time for examing a time sequence of a discharge, or when only a small spectroscope is available. The method of the present invention can be applied even in these cases. In the method of the present invention, gas temperature is obtained by comparing the shape of a quantized emission which is measured as a continuous emission due to a lower resolving power of a spectroscope with a corresponding theoretical emission shape which is obtained through a simulation assuming a lower resolving power.

The analysis described below is substantially along the beforementioned paper by D. M. Phillips, but some deletions and additions are made in consideration of the features of the present invention. Here is referred to only a emission line of $N_2^{14}$ $(C^3\pi_u - B^3\pi_g)^{0'-3''}$ appearing in a range 400–406 nm of the second positive system of nitrogen plasma.

A wave length of a general rotational transition of $C_{v'}J' - B_{v''}J''$ may be calculated by the following equation:

$$\lambda_{B_{v''}J''}^{C_{v'}J'} = \left\{ na \sum_{p=0} \sum_{q=0} Y_{pq}^C (v' + \tfrac{1}{2})^p [J'(J'+1)]^q - Y_{pq}^B (v'' + \tfrac{1}{2})^p [J''(J''+1)]^q \right\}^{-1} \quad (1)$$

where $Y_{pq}^C$, $Y_{pq}^B$ are rotation constants in C state and in B state, respectively, na is dielectric constant of air, v', v'' are rotational oscillation quantum numbers of transition in C state and in B state, and J', J'' are total angular momentums of atoms.

In the actual calculation, it is assumed that J' = J'', namely the total angular momentum does not vary in the C—B transition. The spectroscopic constants including $Y_{pq}^C$, $Y_{pq}^B$ are shown in Table 1.

TABLE 1

| State | Te (eV) | Te (cm$^{-1}$) | To (cm$^{-1}$) | re (Å) | |
|---|---|---|---|---|---|
| $B^3\Pi_g$ | 7.39139 | 59619.20 | 59306.84 | 1.2126 | |
| $C^3\Pi_u$ | 11.05087 | 89136.66 | 88977.89 | 1.1487 | |
| | $Y_{10}$(cm$^{-1}$) | $Y_{20}$(cm$^{-1}$) | $Y_{30}$(cm$^{-1}$) | $Y_{40}$(cm$^{-1}$) | $Y_{50}$(cm$^{-1}$) |
| | 1733.391 | −14.1221 | −5.688 × 10$^{-2}$ | 3.612 × 10$^{-3}$ | −1.109 × 10$^{-6}$ |
| | 2047.178 | −28.4450 | 2.08833 | −5.350 × 10$^{-1}$ | — |
| | $Y_{01}$ (cm$^{-1}$) | $Y_{11}$ (cm$^{-1}$) | $Y_{21}$ (cm$^{-1}$) | $Y_{31}$ (cm$^{-1}$) | $Y_{41}$ (cm$^{-1}$) |
| | 1.6374 | −1.791 × 10$^{-2}$ | −7.647 × 10$^{-5}$ | — | — |
| | 1.82473 | −1.8683 × 10$^{-2}$ | −2.275 × 10$^{-3}$ | 7.33 × 10$^{-4}$ | −1.50 × 10$^{-4}$ |

Spectroscopic Constants in $B^3\Pi_g$ and $C^3\Pi_u$ states.

Equation (1) is developed as follows in a power series of the transition (with band has 4069.4 Å) of $(C^3\pi_u - B^3\pi_g)^{0'-3''}$:

$$\lambda_{B_{v''}J''}^{C_{v'}J'} = \{Y_{10}^C(v'+\tfrac{1}{2}) + Y_{20}^C(v'+\tfrac{1}{2})^2 + Y_{30}^C(v'+\tfrac{1}{2})^3 + \quad (2)$$
$$Y_{40}^C(v'+\tfrac{1}{2})^4 + Y_{01}^C[J'(J'+1)] + Y_{11}^C(v'+\tfrac{1}{2})[J'(J'+1)] +$$
$$Y_{21}^C(v'+\tfrac{1}{2})^2[J'(J'+1)] + Y_{31}^C(v'+\tfrac{1}{2})^3[J'(J'+1)] +$$
$$Y_{41}^C(v'+\tfrac{1}{2})^3[J'(J'+1)] - Y_{10}^B(v''+\tfrac{1}{2}) - Y_{20}^B(v''+\tfrac{1}{2})^2 -$$
$$Y_{30}^B(v''+\tfrac{1}{2})^3 - Y_{40}^B(v''+\tfrac{1}{2})^4 - Y_{50}^B(v''+\tfrac{1}{2})^5 -$$
$$Y_{01}^B[J''(J''+1)] - Y_{11}^B(v''+\tfrac{1}{2})[J''(J''+1)] -$$
$$Y_{21}^B(v''+\tfrac{1}{2})^2[J''(J''+1)]\}^{-1}$$

In the equation (2), the terms other than those expressed as products of the total angular momentum J' and J'' of atoms can be treated as constant. When J' and J'' vary, the frequencies accordingly vary in proportion to the momentums, and the proportion constant is called as a rotational constant, which is indicated with B (or Bv', B', Bv'', or B''). The frequency of each branch is expressed as a function of rotational constants Bv', Bv'' and total angular momentum J.

$$P \text{ branch } \nu = \nu_0 - (B_{v'} + B_{v''})J + (B_{v'} - B_{v''})J^2 \quad (3)$$
$$Q \text{ branch } \nu = \nu_0 - (B_{v'} + B_{v''})J + (B_{v'} - B_{v''})J^2$$

$$R \text{ branch } \nu = \nu_0 + 2B_{v'} + (3B_{v'} - B_{v''})J + (B_{v'} - B_{v''})J^2$$
$$= \nu_0 + (B_{v'} + B_{v''})(J+1) + (B_{v'} - B_{v''})(J+1)^2$$

The results obtained by substituting the figures shown in Table 1 into equation (2) are compared with the results obtained by equation (3). In consideration of the branch feature, R branch is selected for comparison. $B_{v'}$ relating to J' and $B_{v''}$ *relating to J'' are expressed as follows*:

$$B_{v'} = 1.814902 \text{ cm}^{-1} \quad (4)$$

$$V_{v''} = +1.5737782452 \text{ cm}^{-1}$$

Emission intensity $F_{nvJ}$ of a general rotational transition is expressed as follows:

$$F_{nvJ} = h\nu_{nvJ} N_{n'v'J'} A_{nvJ} \quad (5)$$

$$F_{n''v''J''}^{n'v'J'},$$

where $F_{nvJ}$ means $\mu$ indicates transition frequency (Hz) $N_{n'v'J'}$ indicates number of molecules existing at a higher energy rotational state n'v'J' indicates number of molecules existing at a higher energy rotational state $n'v'J'$ and $A_{nvJ}$ indicates a transition probability (S$^{-1}$) of natural emission.

Since the electrical or oscillating behaviors of a molecule is essentially independent from the rotational motion, the transition probability from a branch to a band is independent on the rotational quantum number in an initial stage. In consequence, $$A_{nv} = A_{n''v''J''}^{n'v'J'} = \sum_{J''} A_{nvJ} \quad (6)$$

When line intensity $S_J$ is normalized by the following equation, $$\sum_{J'} S_J = \sum_{J'} \sum_{\Sigma''} \sum_{p'p''} S_{J\Sigma p} \quad (7)$$
$$= (2 - \delta_{o\bar{\Lambda}})(2S+1)(2J'+1)$$

a transition probability from rotational line to band is expressed by the following equation.

$$A_{nvJ} = \frac{A_{nv}S_J}{(2 - \delta_{o\bar{\Lambda}})(2S+1)(2J'+1)} \quad (8)$$

Since, in C–B transition of nitrogen molecule, $\bar{\Lambda} = 1$, and S=1, the following equation is deduced.

$$A^{C_{v'}J}_{B_{v''}J'} = A^{C_{v'}}_{B_{v''}} \frac{S_J}{6(2J+1)} \quad (9)$$

— When spin splittings are neglected, and line intensities are related to quantum numbers for each branch, line intensities are generally expressed by the following equations.

P branch $P(J + 1) = 6(J + 1) - 10/(J + 1)$ (10)

Q branch $Q(J) = 10/J + 10/(J + 1)$

R branch $R(J - 1) = 6J - 10/J$

A general transition of $C_{v'}J - B_{v''}J''$ of nitrogen molecule at temperature T is expressed as follows.

$$F^{C_{v'}J}_{B_{v''}J'}(T) = D \frac{S_J}{T} \exp[-hcB_vJ'(J' + 1)/kT] \quad (11)$$

The width of a rotational line of each quantum number has an influence on the intensity distribution in the band. The shape of the rotational line is presented by the following equation with a sufficient approximation desired for a simplified calculation.

$$g(\Delta\lambda) = \frac{a - (2\Delta\lambda/W)^2}{a + (a - 2)(2\Delta\lambda/W)^2} \quad (12)$$

In this equation, g has a maximum value 1 at $\Delta\lambda=0$, the width at half value is W, and both wings spread over a range $\pm \frac{1}{2} Wa^{\frac{1}{2}}$.

The waveform of $N_2{}^{14}(C^3\pi_u - B^3\pi_g)^{0'-3''}$ has been calculated by using the equations (3), (4), (10) (11) and (12). The angular momentum in P branch has been limited within 29, the angular momentum in Q branch within 20, and the angular momentum in R branch within 25. W has been assumed to be 1.8 Å. The value a is selected as 4, because the value a has little influence on the wave form.

The results of the above-mentioned calculations are described herein below.

BRIEF DESCRIPTION OF THE DRAWINGS

FIG. 2 shows a waveform in case of Tr=500° K. FIG. 3 shows waveforms corresponding to respective branches. FIG. 2 is prepared by superposing the waveforms shown in FIG. 2 with respective weighting factors multiplied. When the temperature Tr is much decreased to 50° K., a waveform shown in FIG. 4, and waveforms for each branch shown in FIG. 5 are obtained. From these figures, it is understood that a transition probability from a position having a great angular momentum quantum number increases as Tr becomes higher, and the curve is more and more apt to extend towards a shorter wave length side. This phenomena is more clearly shown in FIG. 6, where waveforms at Tr of 300° K. and at Tr of 800° K. are simultaneously shown with their emission maximum value located at the same point. The actual value of the maximum intensity is greater in the state of 300° K. than in the state of 800° K., because the transition probability in the state of 300° K. exists in a lower energy region in comparison with that in the state of 800° K. Although, in the above-mentioned figures, W is selected as 1.8 Å, which is near the actual value, a calculation is also carried out for a case where W is 0.1 Å which is possible when a spectroscope of high resolving power is used, and the results are shown in FIG. 7 corresponding to FIG. 2, in FIG. 8 corresponding to R branch of FIG. 3, and in FIG. 9 corresponding to FIG. 4 for 50° K. of Tr. However, as mentioned before, the use of a spectroscope of high resolving power includes several problems such as the apparatus become in a large scale, the oscillation in the plasma treating device is not negligible, and a long time is required for measurement, thereby decreasing the practical merit of the apparatus.

DETAILED DESCRIPTION OF PREFERRED EMBODIMENTS

The embodiments of the present invention is described below.

Figure 1:
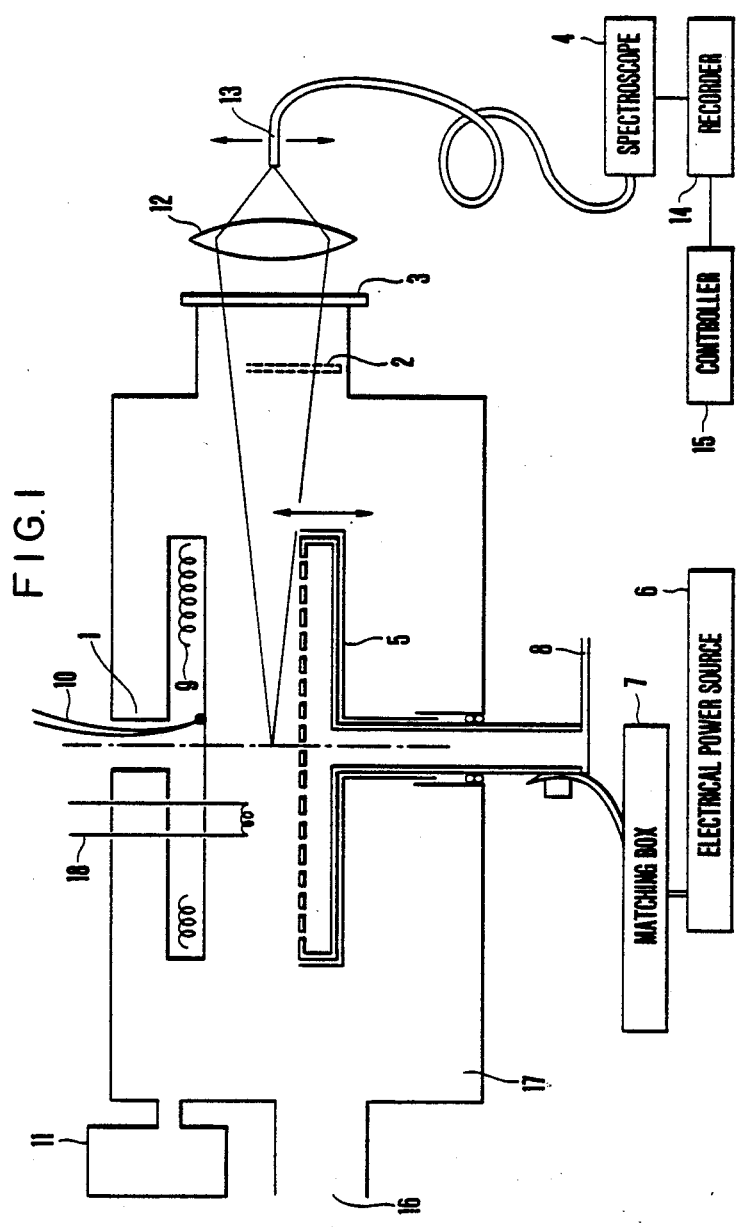
FIG. 1 is a schematic view of a plasma treating apparatus according to the present invention.
Figure 2:
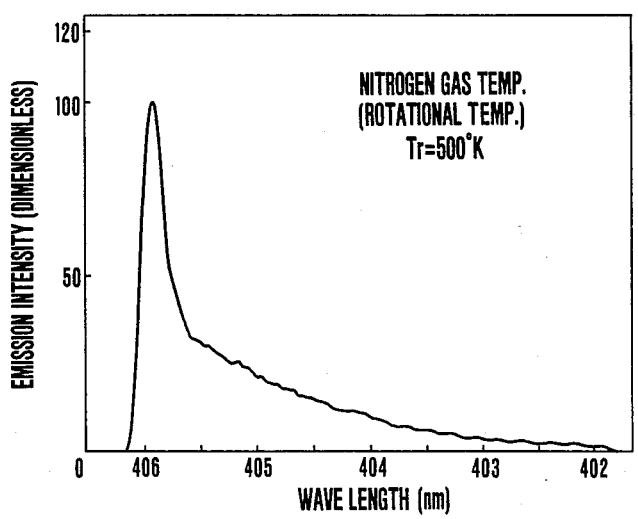
FIG. 2 shows a calculated waveform of $N_2{}^{14}(C^3\pi_u - B^3\pi_g)^{0'-3''}$ in case of rotational temperature 500° K.
Figure 3:
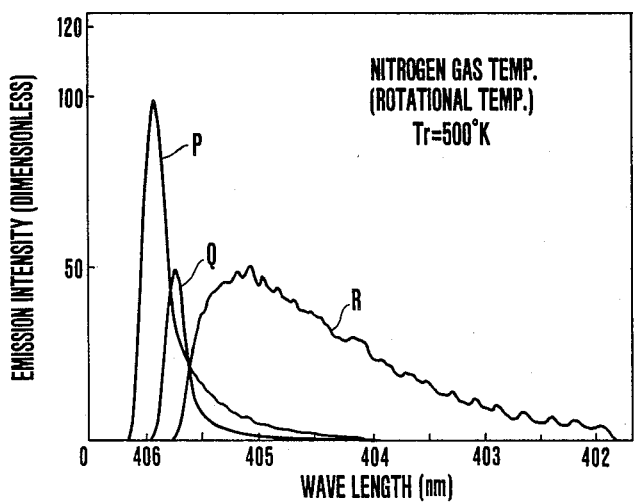
FIG. 3 shows a calculated waveforms of $N_2{}^{14}(C^3\pi_u - B^3\pi_g)^{0'-3''}$ in case of rotational temperature 500° K., for P, Q and R branches, respectively.

FIG. 1 shows a plasma treating apparatus of the present invention. Base holder 1 has a diameter of about 30 cm. Plasma emissions are taken out through a view port 3 provided with a shutter 2, and analyzed by a spectroscope 4. There are shown a electrode 5 which supplies electric power for producing plasma, an electric power source 6, a matching box 7, a gas inlet port 8, a substrate heater 9, a thermocouple 10 for monitoring a set temperature value for the substrate heating, and a vacuum gauge 11. In order to measure a spatial distribution of rotational temperature Tr in the space between the electrodes, a quartz lens 12 and a light fiber 13 are provided between the view port 3 and the spectroscope 4. Data obtained by the spectroscope 4 are recorded in a recorder 14, and used through a controller 15 for increasing or decreasing the electric power to the heater 9, for changing the gas flow rate, for increasing or decreasing the electric power producing plasma, for raising or lowering the height of the electrode 5, or for increasing or decreasing the conductance of an exhaust system 16. As occasion demands, a tungsten heater is arranged in the plasma treating room 17 for creating a local heating. The resulted data are described below.

Figure 10:
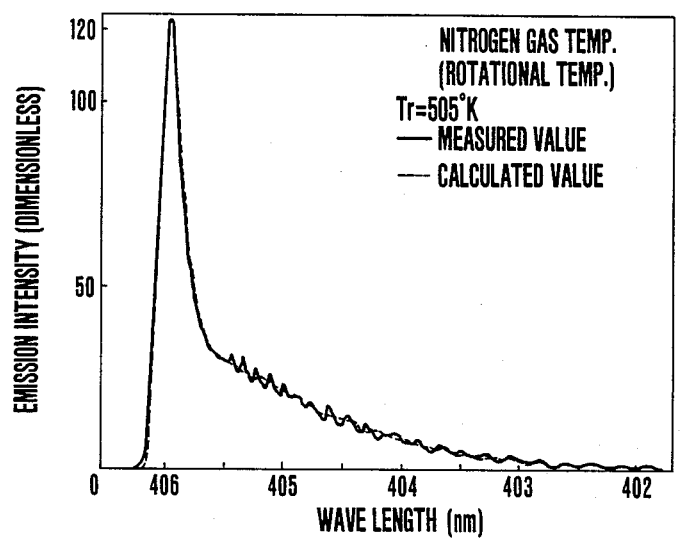
FIG. 10 shows a comparison between a calculated data and a measured data.

Data 1:

FIG. 10 shows a typical comparison between calculated values indicated with broken line and measured values indicated with solid line. In this case, the rotational temperature Tr of 505° K. is obtained.

Data 2:

Change of Tr has been measured with the distance d between substrate holder 1 and electrode 5 which is changed while the pressure in room 17, the electric power Po for producing plasma, and the temperature set value Ts for the substrate are maintained constant. When the distance d is decreased, Tr remains constant until the distance reaches a certain value, and decreases when the distance is further decreased. (p=1 Torr, Po=30 W, Ts=200° C.)

Data 3:

Change of Tr has been measured with pressure Po, distance d and temperature Ts being maintained constant, and with pressure p being varied. When the p is being decreased, Tr remains constant until p reaches a certain value, and decreases as the pressure p is further decreased.

Figure 11:
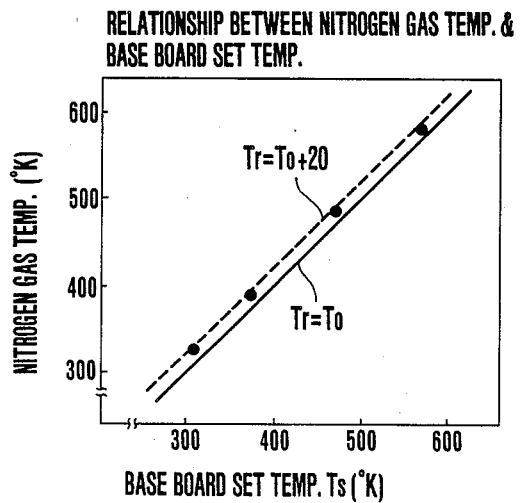
FIG. 11 shows a relationship between temperature set values and nitrogen gas temperature.

Data 4:

Change of Tr has been measured with p, Po and d being maintained constant, and with Tr being varied. The result is shown in FIG. 11. The measurement has been carried out in a manner that, after being left for two hours from the time when Ts has been varied, Tr has been measured, and this measuring process is repeated. As shown in FIG. 11, it has been disclosed Tr increases in proportion to Ts. (p=1 Torr, Po=30 W, d=18 mm)

Data 5:

Change of Tr has been measured with p, Po, d and Ts being maintained constant, and with the nitrogen gas being mixed with $SiH_4$ gas. When the flow rate of $SiH_4$, $Si_2H_6$ is being increased, Tr decreases rapidly until the flow rate reaches a certain value, and remains constant when the flow rate is further increased. (p=1 Torr, Po=30 W, d=18 mm, Ts=R.T. or 300° C.)

Data 6:

Change of Tr has been measured with p, Po, d and Ts being maintained constant, and with the nitrogen gas mixed with $NH_3$, $NH_4OH$, $H_2O$, $H_2$, $SiF_4$, $CH_4$, $SF_6$, $CF_4$, $N_2O$, $NF_3$, and $NO_2$. When the gas flow rate is increased, Tr decreases gradually until the flow rate reaches a certain value, and remains constant when the flow rate is further increased. (p=1 Torr, Po=30 W, d=18 mm, Ts=R.T. or 300° C.)

Data 7:

Change of Tr are measured with p, d, Ts and nitrogen gas is maintained constant and with Po being varied. Tr increases substantially in proportion to the increase of Po. Comparing with Data 4, it is found Ts is slightly lower than Tr in case of Po of O W. This value depends, as a matter of course, on the individual apparatus and on the mounting configuration and position of the thermocouple for monitoring the set temperature of the substrate. This data is the same as included in the aforementioned paper by D.D. Phillips (J. Phys. D, vol. 9, page 507, 1975). However this paper refers only to what manner the nitrogen gas temperature is raised according to the irradiation time length of exciting laser beams.

Data 8:

Special distributions of the rotational temperature Tr between the electrodes are measured with all conditions maintained constant. Plasma emissions are collected through quartz lens 12, and the collected emission is measured by finely adjusting the location of the tip of an optical fiber 13 at the position of the collected emission by use of a X-Y manipulator Tr is highest near base holder 1, gradually decreases with distance from base holder 1, and become again higher near the electrode 3 supplying electric power for producing plasma. This tendency does not change, even if any condition is changed Generally, Tr is highest at the center of base holder 1, and decreases with approach to the periphery of base holder, although the temperature distribution vary in dependence on electric discharge conditions.

Data 9:

When a tungsten heater is arranged in the plasma treating room 10, Tr is considerably raised around the tungsten heater.

Data 10:

When the discharge condition is deviated from the normal states as to allow local abnormal discharges to be produced in the plasma treating room, Tr is raised at and around the abnormal discharge positions.

Based on these data, methods of maintaining a plasma treating apparatus in a stable state have bee studied, embodiments of them being described below.

Figure 4:
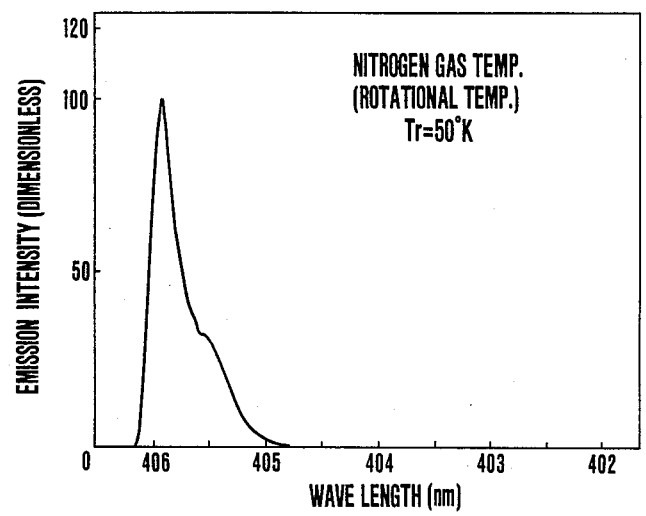
FIG. 4 shows a calculated waveform in case of rotational temperature 50° K.
Figure 5:
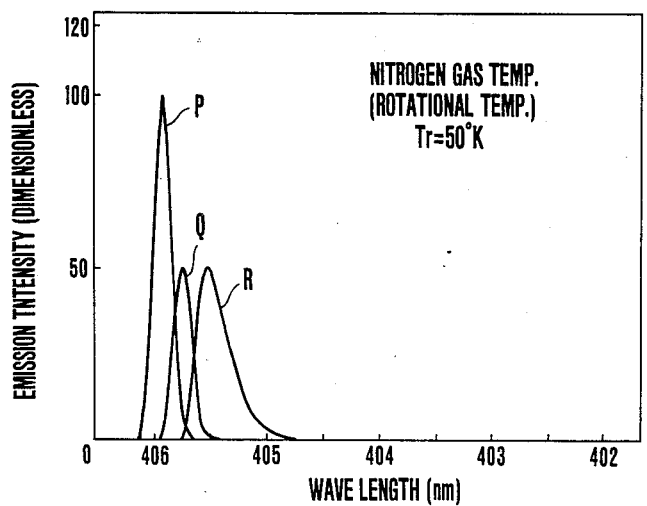
FIG. 5 shows calculated waveforms of $N_2{}^{14}(C^3\pi_u - B^3\pi_g)^{0'-3''}$ for P, Q and R branches, respectively, in case of rotational temperature 500° K.
Figure 6:
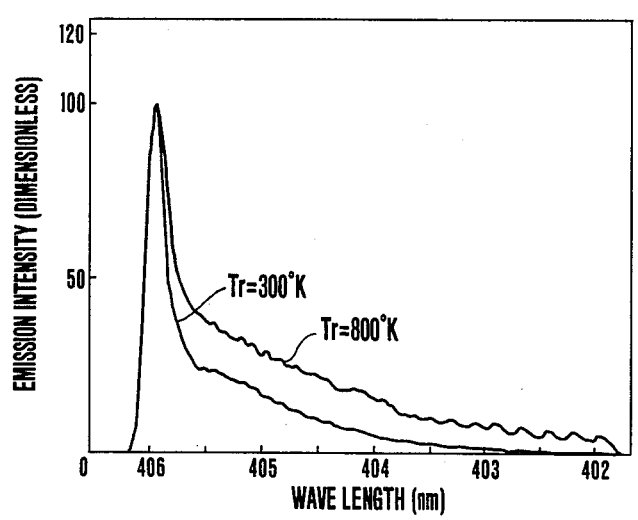
FIG. 6 shows calculated waveforms in cases of rotational temperatures 300° K. and 800° K.
Figure 7:
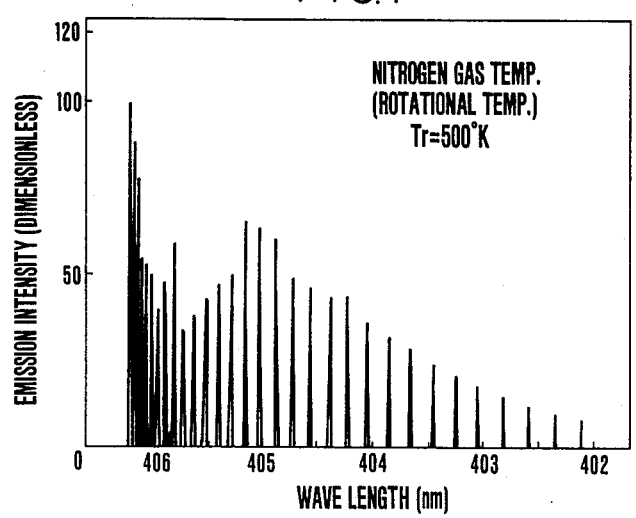
FIG. 7 shows a calculate waveform obtained through a spectroscope having a high resolution of 0.1 Å in case of rotational temperature of 500° K.
Figure 8:
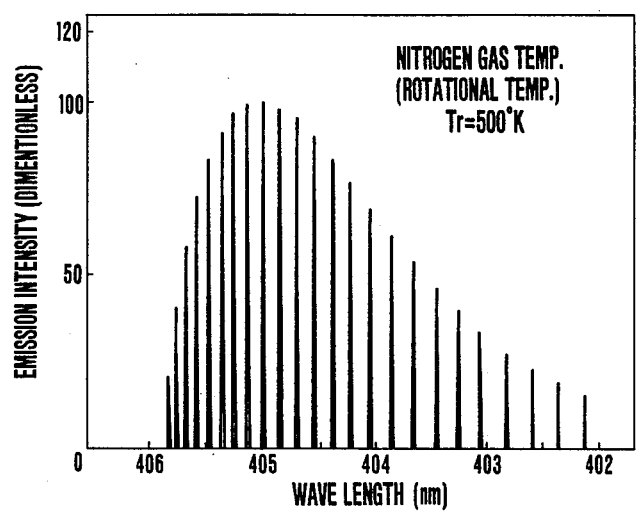
FIG. 8 shows a waveform for R branch of FIG. 7.
Figure 9:
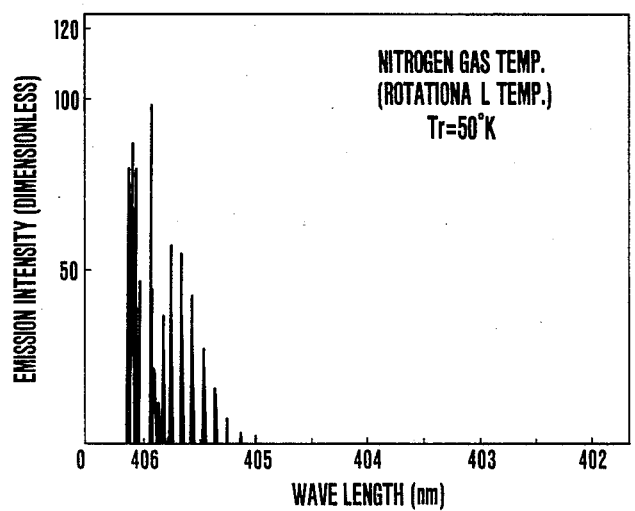
FIG. 9 shows waveforms for P, Q and R branches obtained through a spectroscope having high resolution of 0.1 Å in case of rotational temperature of 500° K.

Embodiment 1:

A method of processing data obtained through spectroscope 4 and recorded by a recorder 14 by using controller 15 is described here. An example of the data received by recorder 14 is shown in FIG. 10 with a solid line. It requires a too long time and a large scale controller to compare measured data with calculated values over the total range of the data and to make them coincident with each other by using controller 15. In the present invention, an attention has been paid to the fact that, when the emission intensity peaks of these data around 406 nm are located at the same point. Although waveforms are remarkably changed at very low temperatures as shown in FIG. 4, the emission intensity curve in range 406–402 nm shifts in parallel towards a higher position or a lower position in a temperature range in which the plasma apparatus can be used. Calculated data obtained for various nitrogen gas temperatures are normalized with the emission intensity peak values, are made coincident together, and used as a data base. The temperatures are set at intervals of 5° K. On the otherhand, measured data for plasma emission intensity are also similarly normalized by controller 15 with the peak value near 406 nm similar to the above-mentioned calculated data base. The normalized, measured data is compared with the intensity of emission at the wave length 404.5 nm. When the measured data is greater than the corresponding data in the data base, which means the nitrogen gas temperature for plasma treatment is higher, a feedback signal generated in controller 15 based on the aforementioned data 1-10 is fed back, for adjusting the nitrogen temperature to a desired value, to at least one of the electric power source for producing plasma, the distance between the power supply electrode and the substrate and the electric power source for heating substrate. For lowering the nitrogen gas temperature, it is effective to decrease the electric power for plasma, to decrease the distance between electrodes, to decrease the pressure in the plasma treating room, or to decrease the electric power for substrate heating. By applying these operations, the nitrogen gas can be controlled with a precision of ±10° K. The repeatability of these plasma treating processes have been confirmed.

Embodiment 2

This embodiment is suitable when a more precise temperature control is required. In place of one wave length 404.5 nm in Embodiment 1, a plurality of wave lengths are selected for the comparison. Namely, five wave lengths of 403.0 nm, 403.5 nm, 404.0 nm, 404.5 nm and 406.0 nm, or six wave lengths from 404.0 nm to 405.0 nm with intervals 0.2 nm are selected, and at these wave lengths, adjustments are carried out to make measured emission intensity coincident with the value in the data base, or to make minimum the sum of the differences therebetween. This sum is not a sum of absolute values, but is an algebraic sum. In this Embodiment, the nitrogen gas temperature has been controlled with a precision ±5° K.

Embodiment 3

A point for controlling nitrogen gas temperature is how the measured data can be compared with the data in the data base. Another point is how the emission spectrum to be measured is taken out. As mentioned before, the nitrogen gas temperature depends on a sum of energies given by a electric power supplied from a electric power source for producing plasma and by surface temperatures of members contacting with plasma or gas to be turned into plasma in a plasma treating room. The feature of nitrogen gas temperature should be known with respect to its dependency on local positions and to its linearity in response to increase and decrease in these energies. The gas temperature has been examined while varying individually one of the above-mentioned influence factors, or varying both of the factors simultaneously. As a result, the precision of the measured gas temperature has been enhanced by comparing a temperature at the center of substrate holder 1 in plasma treating room 17 with at least a temperature at the periphery of the holder, and adjusting the apparatus so that these two temperatures are held in a predetermined range of the nitrogen gas temperature. The method of this embodiment has been required in consideration that in a measurement where the plasma emission is taken out from a rather wider region for increasing emission amount, the measurement will be disturbed by local dispersion of nitrogen gas temperature caused by superposed temperatures.

Embodiment 4

This embodiment originates from a measurement case where it has been impossible to control the nitrogen gas temperature in order to make the same coincident with a temperature in the data base. This failure was caused by an abnormal discharge. In case the nitrogen gas temperature can not be controlled by changing a predetermined discharge condition, an indicator system has been provided for indicating an abnormality to the controller. This indicator system has been effective not only for detecting an abnormal discharge, but also for detecting other various abnormalities occurring in producing plasma, such as abnormalities of a conductance change valve of exhaust system or a supply gas inlet valve, abnormalities of heater 9 for substrate such as breakage or shortcircuit, abnormalities of vacuum gauge 11, thermocouple 10, a power source for producing plasma, a blur a plasma-made-film deposition on view port 3, and so on.

Embodiment 5

In the embodiments mentioned above, a pure nitrogen gas or a nitrogen gas mixed with gases having no severe influences on the nitrogen gas temperature in a plasma state or on the emission waveform in a range from 406 nm to 402 nm is used as a raw material gas. As a matter of fact, all gases other than nitrogen gas have influences some on nitrogen plasma. In this embodiment, the influences of a mixed gas on the nitrogen gas temperature and on the emission waveform in a range from 406 nm to 402 nm are minimized by incorporating nitrogen gas temperatures and emission waveforms obtained through the beforementioned Data 5 and Data 6, and by using a data base correspondingly to the mixed gas having a special mixing ratio.

Embodiment 6

In the embodiments above, a gas including nitrogen gas is used as a raw material gas. Here will be described that the present invention can be applied even such processes that nitrogen is not included in the raw material gas, or even though included in a raw material gas, give the following three conditions:

1. No influence:

An etching process for etching a thin film of Si group by using $SF_6$ has suffered no influence from the nitrogen of less than 1% content. In this case, although the emission intensity is generally lowered, temperature rises of nitrogen gas due to heating at higher temperature portions in the plasma treating room such as at the substrate and the like, and also temperature drops thereof due to cooling at unetching positions such as view port or various sensors have been observed.

2. Negligible influence:

A deposition process for depositing a $\alpha$—Si : H film by using $SiH_4$ gas has suffered substantially no influence from the mixed nitrogen gas of less than 1% content with respect to its light conductivity or its electron motions. Nitrogen gas emissions have been observed in the plasma, and can be used for monitoring temperatures at the substrate surface and so on. 3. Influence is not negligible, but corrections can be made in later processes:

In an etching process for etching an Si group thin film by using a mixed gas of $CF_4$ and $O_2$, the etching process has been possible even when nitrogen gas of about 10% content is mixed. Although some thin foreign matter has remained on the surface, they can be removed by using hydrofluoric acid. In this case, nitrogen gas emissions have been also observed.

As mentioned above, according to the present invention, the surface temperatures of the substrate in the course of plasma treatment, which have been difficult to be detected in prior arts, can be detected. High temperature portions and low temperature portions in a plasma treating room can be detected by measuring nitrogen plasma gas temperatures. Thus, any abnormality in a plasma treatment can be easily detected.

What is claimed is:

1. A plasma treating apparatus, comprising
   an electric power source and movable electrodes for producing plasma in a gaseous material including nitrogen atoms,
   a plasma treating room,
   means for moving said electrodes
   means for establishing a gaseous material atmosphere including nitrogen atoms, in said room, a substrate which is subjected to an etching process or a depositing process by using said plasma, an electric power source for heating said substrate, a spectroscope capable of detecting nitrogen molecule emissions due to transitions between rotational quantum numbers as continuous emissions, a recorder for recording said measured emissions, and a controller capable of feeding back the data detected by said spectroscope and recorded by said recorded to at least one of said electric power source for producing said plasma, said electric power source for heating said substrate, said establishing means, and said means for moving said electrodes.

2. A plasma temperature measuring method, comprising steps of calculating a theoretical nitrogen plasma emission intensity at various gas temperatures, measuring an actual nitrogen plasma emission intensity in a plasma treating room, comparing said measured emission intensity with said calculated emission intensity at a peak spectrum in a range from 400 nm to 406 nm among dissociated emission spectra of nitrogen molecules, distinguishing, through said comparison, a temperature rise of nitrogen gas caused by said electric power source for generating plasma from a temperature rise caused by heated bodies such as a substrate, a substrate holder and the like or by local heat sources or abnormal electric discharges.

3. A plasma treating apparatus as in claim 1 wherein said controller is capable of feeding back the data to said electric power source for producing said plasma.

4. A plasma treating apparatus as in claim 1 wherein said controller is capable of feeding back the data to said electric power source for heating said substrate.

5. A plasma treating apparatus as in claim 1 wherein said controller is capable of feeding back the data to said establishing means.

6. A plasma treating apparatus as in claim 1 wherein said controller is capable of feeding back the data to said means for moving said electrodes.

* * * * *